US010091880B2

(12) United States Patent
Nam et al.

(10) Patent No.: US 10,091,880 B2
(45) Date of Patent: Oct. 2, 2018

(54) PRINTED CIRCUIT BOARD UNIT DISPLAY APPARATUS AND METHOD OF MANUFACTURING THE DISPLAY APPARATUS

(71) Applicant: Samsung Display Co., Ltd, Yongin-si, Gyeonggi-do (KR)

(72) Inventors: Jeong-mo Nam, Incheon (KR); Sung-dong Park, Asan-si (KR); Mikyung Kang, Ulsan (KR); Sun-mi Son, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 147 days.

(21) Appl. No.: 14/984,338

(22) Filed: Dec. 30, 2015

(65) Prior Publication Data
US 2016/0205786 A1    Jul. 14, 2016

(30) Foreign Application Priority Data

Jan. 14, 2015  (KR) .......................... 10-2015-0006709

(51) Int. Cl.
*H05K 1/14* (2006.01)
*H05K 1/02* (2006.01)
*H05K 3/36* (2006.01)

(52) U.S. Cl.
CPC ........... *H05K 1/147* (2013.01); *H05K 1/0278* (2013.01); *H05K 1/148* (2013.01); *H05K 3/361* (2013.01); *H05K 2201/09018* (2013.01); *H05K 2201/09063* (2013.01); *H05K 2201/10128* (2013.01); *H05K 2201/10681* (2013.01)

(58) Field of Classification Search
CPC ...... H05K 1/147; H05K 1/148; H05K 1/0278; H05K 3/361; H03K 3/361
See application file for complete search history.

(56) References Cited

U.S. PATENT DOCUMENTS

| 4,335,272 | A | * | 6/1982 | Pittenger | H05K 1/148 174/254 |
| 4,742,183 | A | * | 5/1988 | Soloway | H05K 1/148 174/254 |
| 5,640,216 | A | * | 6/1997 | Hasegawa | G02F 1/1345 349/158 |
| 5,680,183 | A | * | 10/1997 | Sasuga | G02F 1/133308 349/150 |
| 7,123,249 | B2 | * | 10/2006 | Takenaka | G02F 1/13452 345/206 |

(Continued)

FOREIGN PATENT DOCUMENTS

| KR | 2003199000000 | 7/2003 |
| KR | 10-2006-0079984 A | 7/2006 |

(Continued)

*Primary Examiner* — Nathan Milakovich
(74) *Attorney, Agent, or Firm* — Innovation Counsel LLP

(57) ABSTRACT

Provided is a method of manufacturing a display apparatus. The method includes: preparing a printed circuit board including a first printed circuit unit and a second printed circuit unit; providing, on the printed circuit board, a connection member electrically connecting the first printed circuit unit to the second printed circuit unit; coupling one end of a tape carrier package to the printed circuit board; coupling the other end of the tape carrier package to a display panel; and cutting the printed circuit board into the first printed circuit unit and the second printed circuit unit that move relative to each other.

8 Claims, 8 Drawing Sheets

(56) References Cited

U.S. PATENT DOCUMENTS

| | | | |
|---|---|---|---|
| 7,143,504 B2* | 12/2006 | Tanaka | G02F 1/13452 29/592.1 |
| 7,705,812 B2* | 4/2010 | Yuda | G02F 1/13452 345/206 |
| 7,746,439 B2* | 6/2010 | Kohno | G02F 1/13452 349/150 |
| 8,493,377 B2* | 7/2013 | Takai | G09G 3/2092 345/211 |
| 9,560,761 B2* | 1/2017 | Kishida | H05K 1/028 |
| 9,801,278 B2* | 10/2017 | Lee | H05K 1/147 |
| 9,812,800 B2* | 11/2017 | Lee | H01R 12/771 |
| 2015/0189755 A1* | 7/2015 | Choi | H05K 1/028 361/749 |
| 2015/0245488 A1* | 8/2015 | Jang | G06F 1/16 361/749 |
| 2015/0316810 A1* | 11/2015 | Shibahara | G02F 1/1333 349/150 |
| 2016/0066410 A1* | 3/2016 | Cho | H05K 1/028 361/749 |

FOREIGN PATENT DOCUMENTS

| | | |
|---|---|---|
| KR | 10-2008-0011549 A | 2/2008 |
| KR | 10-2008-0114052 A | 12/2008 |
| KR | 10-2011-0077550 A | 7/2011 |
| KR | 10-2014-0091978 A | 7/2014 |
| KR | 10-2015-0070755 | 6/2015 |
| KR | 1020150111545 | 10/2015 |

* cited by examiner

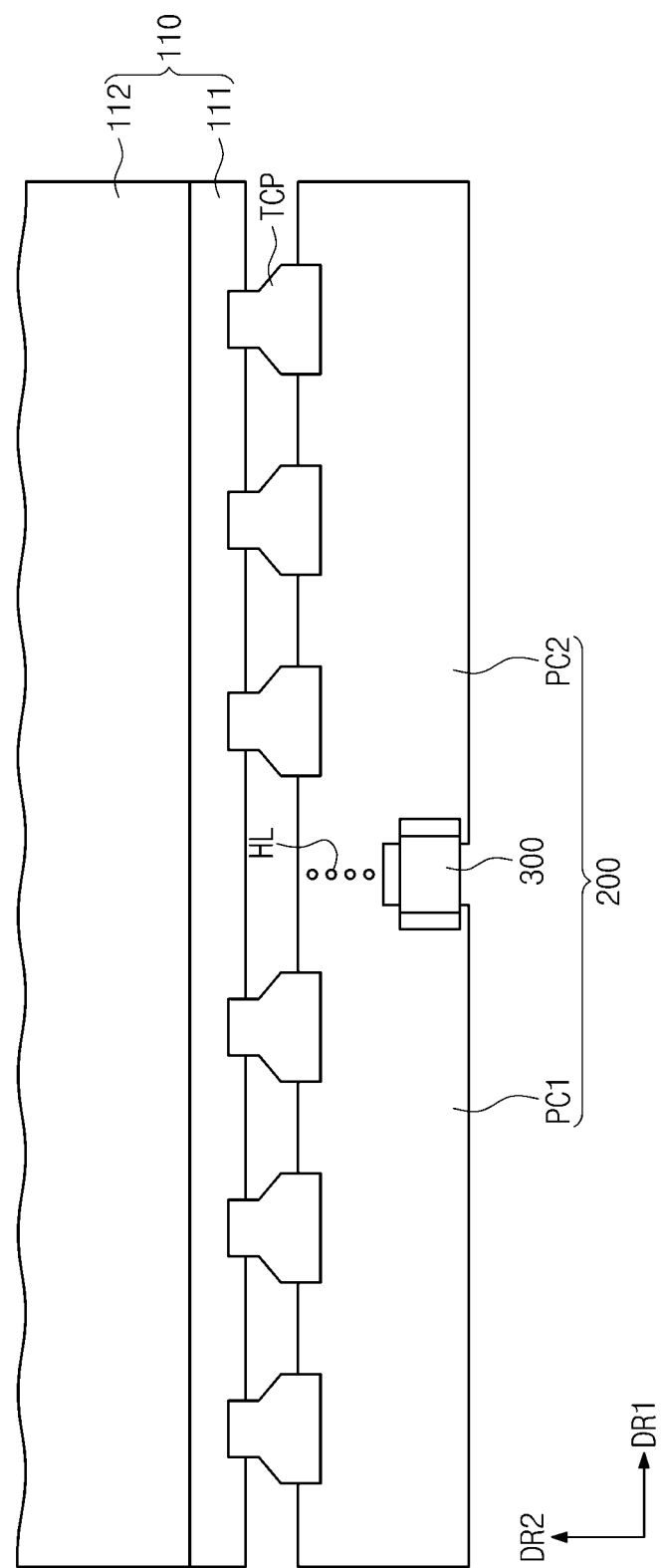

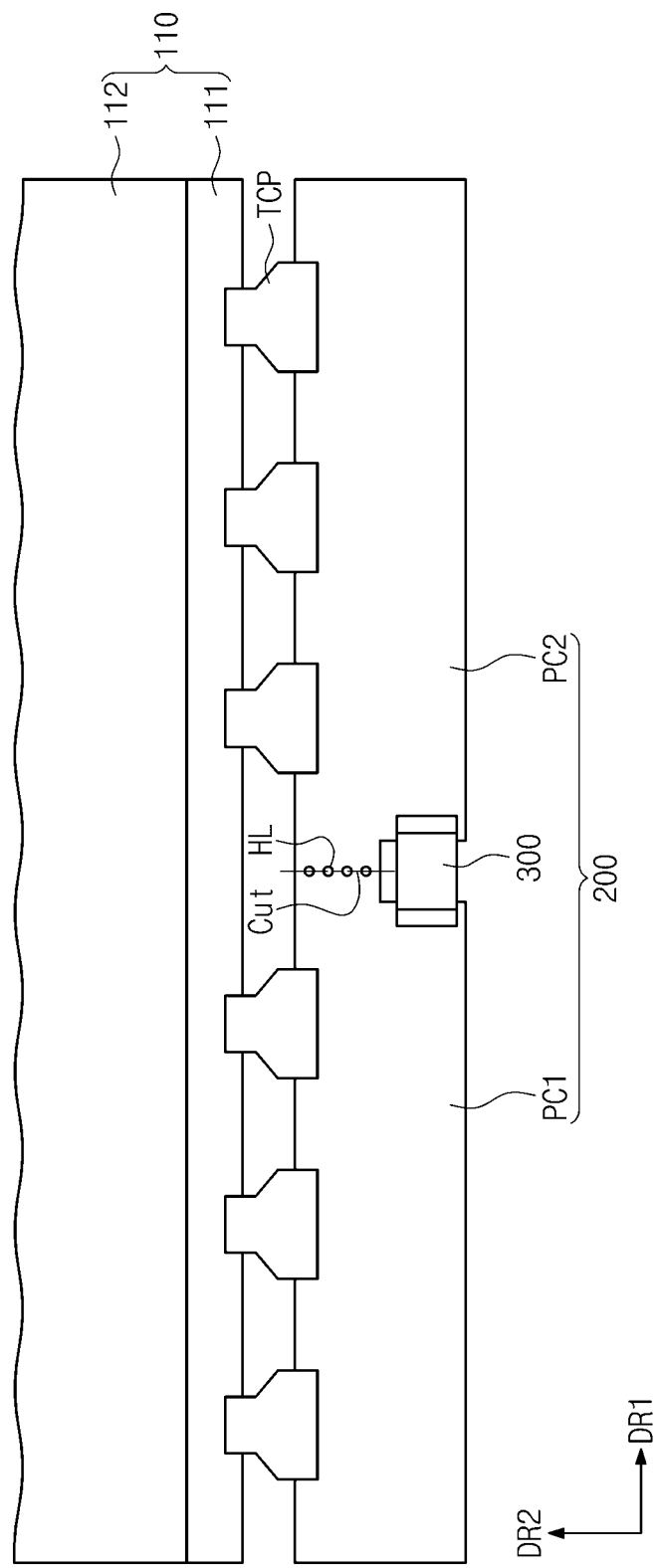

PRINTED CIRCUIT BOARD UNIT DISPLAY APPARATUS AND METHOD OF MANUFACTURING THE DISPLAY APPARATUS

CROSS-REFERENCE TO RELATED APPLICATIONS

This U.S. non-provisional patent application claims priority under 35 U.S.C. § 119 of Korean Patent Application No. 10-2015-0006709, filed on Jan. 14, 2015, the entire contents of which are hereby incorporated by reference.

BACKGROUND

The present disclosure herein relates to a printed circuit board, a display apparatus, and a method of manufacturing the display apparatus, and more particularly, to an easily manufacturable printed circuit board, a display apparatus, and a method of manufacturing the display apparatus.

A display apparatus includes a display panel, a printed circuit board driving the display panel, a tape carrier package (TCP) electrically connecting the display panel and the printed circuit board. Generally, the tape carrier package is attached to the printed circuit board, and then a curvature is formed on the printed circuit board. When the display panel or the printed circuit board has a curvature, the tape carrier packages receive different stresses, different tensions, or the like depending on how and where the TCP is attached to the display panel or the printed circuit board. If the printed circuit board does not have enough elasticity to withstand the stresses, tensions, or the like, the tape carrier packages receive force from both ends of the printed circuit board, resulting in increased gaps between the tape carrier packages may be increased. As a consequence, a failure/defect may be generated in the display apparatus.

SUMMARY

The present disclosure provides an easily manufacturable printed circuit board, a display apparatus, and a method of manufacturing the display apparatus.

Embodiments of the inventive concept provide methods of manufacturing a display apparatus, the methods including: preparing a printed circuit board comprising a first region, a second region, and a third region wherein the second region is between the first region and the third region, the first region including a first printed circuit unit, the third region including a second printed circuit unit, and the second region having an opening; providing, on the printed circuit board, a connection member electrically connecting the first printed circuit unit and the second printed circuit unit; coupling the other end of the tape carrier package to a display panel; and cutting the second region to divide the printed circuit board into the first printed circuit unit and the second printed circuit unit.

The methods may further include bending the display panel in a first direction, wherein the first region, the second region, and the third region are arranged in the first direction.

The methods may further include forming one or more holes in the second region, wherein the second region on which the holes are formed is cut to divide the printed circuit board into the first printed circuit unit and the second printed circuit unit.

The connection member may be provided on the printed circuit board to cover at least part of the opening.

The connection member may include a first coupling part, a second coupling part, and a connection part connecting the first coupling part to the second coupling part, and the providing of the connection member may include: bending a boundary between the first coupling part and the connection part; bending a boundary between the second coupling part and the connection part; electrically connecting the first coupling part to the first printed circuit unit; and electrically connecting the second coupling part to the second printed circuit unit.

The connection member may include a first coupling part, a second coupling part, and a connection part connecting the first coupling part to the second coupling part without covering the opening, and the providing of the connection member may include: electrically connecting the first coupling part to the first printed circuit unit; and electrically connecting the second coupling part to the second printed circuit unit.

One side of the connection part has a bent portion in plan view, the one side of the connection part facing the opening.

After the tape carrier package is attached to the display panel, the printed circuit board may be divided into the first printed circuit unit and the second printed circuit unit, and after the printed circuit board is divided into the first printed circuit unit and the second printed circuit unit, the display panel may be curved in a first direction.

In other embodiments of the inventive concept, printed circuit board units include: a first printed circuit unit; a second printed circuit unit electrically connected to the first printed circuit unit; an opening defined between the first printed circuit unit and the a second printed circuit unit; and a connection member coupled to each of the first printed circuit unit and the second printed circuit unit to electrically connect the first printed circuit unit and the second printed circuit unit.

The printed circuit board units may further include one or more holes defined between the first printed circuit unit and the second printed circuit unit.

The connection member may cover the opening and electrically connect the first printed circuit unit and the second printed circuit unit.

The connection member may include: a first coupling part coupled to the first printed circuit unit; a second coupling part coupled to the second printed circuit unit; and a connection part connecting the first coupling part to the second coupling part and covering the opening, wherein the first coupling part meets the connection part at a bent portion, the second coupling part meets the connection part at a bent portion.

The connection part may include one or more surfaces joined at an angle.

The connection member may include: a first coupling part coupled to the first printed circuit unit; a second coupling part coupled to the second printed circuit unit; and a connection part connecting the first coupling part to the second coupling part by extending around the opening.

One side of the connection part that faces the opening has a bent portion.

In still other embodiments of the inventive concept, display apparatuses include: a display panel displaying an image and curved in a first direction to have a curvature; a printed circuit board comprising a first printed circuit unit electrically connected to the display panel, a second printed circuit unit electrically connected to the display panel, and an opening defined between the first printed circuit unit and the second printed circuit unit; and a connection member electrically connecting the first printed circuit unit and the second printed circuit unit while allowing the first printed circuit unit to move relative to the second printed circuit unit, wherein the connection member adapts to the positions of the first printed circuit unit and the second printed circuit unit.

The connection member may include: a first coupling part coupled to the first printed circuit unit; a second coupling part coupled to the second printed circuit unit; and a connection part connecting the first coupling part to the second coupling part.

The connection member may cover the opening, and the first coupling part joins the connection part to form a bent portion, and the second coupling part joins the connection part to form a bent portion.

The relative positions of first printed circuit unit and the second printed circuit unit may change according to the curvature.

The connection part extends around the opening, and the side of the connection part facing the opening has a bent portion.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 7 and 8 are schematic views illustrating a method of manufacturing a display apparatus.

DETAILED DESCRIPTION OF THE EMBODIMENTS

Figure 1:
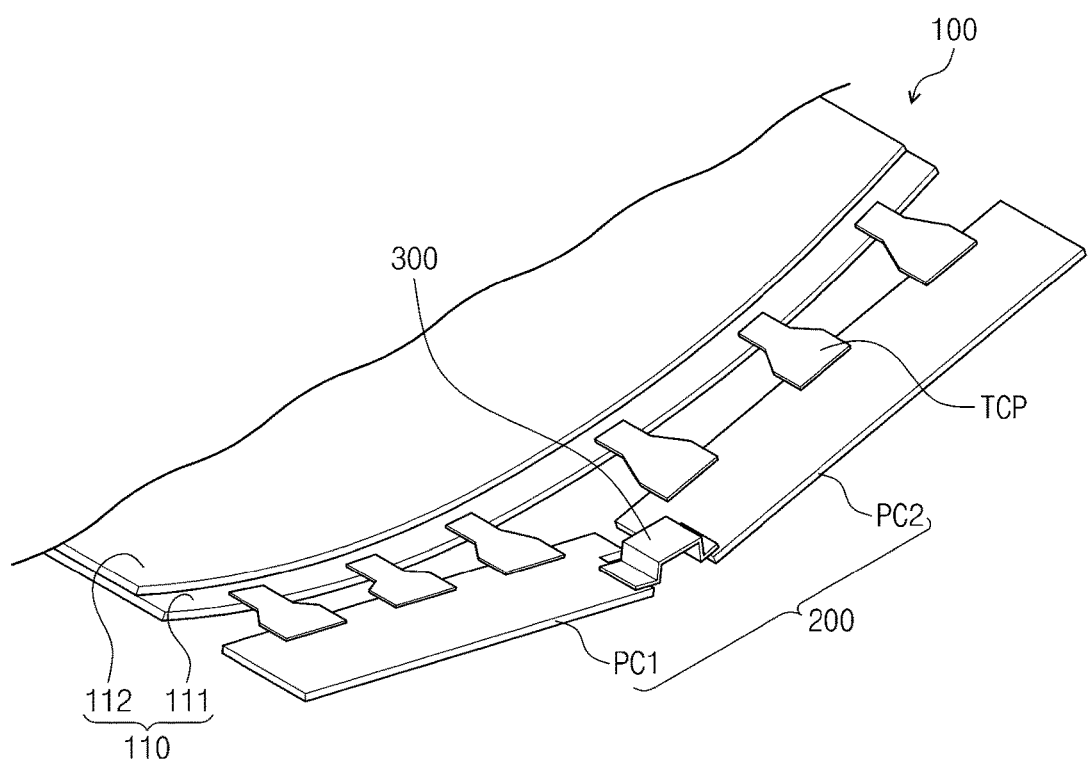
FIG. 1 is a schematic perspective view illustrating a display apparatus according to an embodiment of the inventive concept.

Hereinafter, specific embodiments of the inventive concept will be described in detail with reference to the accompanying drawings. Objects, features, and effects of the inventive concept will be clarified through following embodiments related to the accompanying drawings. The inventive concept may, however, be embodied in different forms and should not be construed as limited to the embodiments set forth herein. Embodiments of the inventive concept, which will be described later, are provided so that this disclosure will be thorough and complete, and will fully convey the concept of the invention concept to those skilled in the art. Therefore, the inventive concept should not be construed as being limited to the embodiments as will be described later. Meanwhile, like reference numerals refer to like elements throughout.

Also, throughout the specification, terms such as "first", "second" and the like were not used to limit the meaning or the scope of the inventive concept, but merely used to differentiate one member from another one. In the description, it will be understood that when a film, a region, or an elements is referred to as being "above" or "on" another element, it can be directly on the other element or intervening elements may also be present.

FIG. 1 is a schematic perspective view illustrating a display apparatus according to an embodiment of the inventive concept.

Referring to FIG. 1, a display apparatus 100 may include a display panel 110, a printed circuit board 200, tape carrier packages TCP, and a connection member 300.

The display panel 110 may display an image. The display panel 110 may be any one of a liquid crystal display panel, an electro wetting display panel, an electrophoretic display panel, a micro electro mechanical system (MEMS) display panel, and an organic light emitting display panel. In the present embodiment, the liquid crystal display panel will be described as an example, but the inventive concept is not limited thereto.

When the display panel 110 is a liquid crystal display panel, the display apparatus 100 may further include a backlight unit (not shown) supplying light to the display panel 110. The back light unit may include a light-emitting diode emitting light to be supplied to the display panel 110, optical sheets diffusing light, a bottom chassis accommodating the light-emitting diode and the optical sheets, and the like.

The display panel 110 may be in the shape of a rectangular plate that has two pairs of sides. In the present embodiment, the display panel 110 may have a rectangular shape that has a pair of long sides and a pair of short sides. The display panel 110 may include a lower substrate 111, an upper substrate 112 opposed to the lower substrate 111, and a liquid crystal layer (not shown) interposed between the lower substrate 111 and the upper substrate 112. The display panel 110 may have a display region on which an image is displayed; and a non-display region surrounding the display region, and on which an image is not displayed when viewed in a plan view.

A plurality of pixels are provided on the lower substrate 111 in a matrix configuration. In addition, each of the plurality of the pixels may include a gate line (not shown), a data line (not shown) insulated from the gate line and intersecting with the gate line, and a pixel electrode (not shown). Also, a thin film transistor (not shown) is provided to each pixel, and may be electrically connected to the gate line, the data line, and the pixel electrode.

An RGB (red, green, and blue) pixel that is a color pixel and a common electrode (not shown) opposed to the pixel electrode may be formed on the upper substrate 112. In another embodiment, the color pixel and the common electrode may be provided on the lower substrate 111. Liquid crystal molecules constituting the liquid crystal layer are aligned according to the intensity of electric field formed between the pixel electrode and the common electrode, and thus may adjust transmittance of light supplied from the backlight unit to display desired gradation.

The display panel 110 may be flexible. The display panel 110 may have a shape curved in a first direction DR1. For example, the display panel 110 may be convex or concave in a thickness direction.

The printed circuit board 200 may be electrically connected to the display panel 110. For example, the printed circuit board 200 may be connected to at least one side of the lower substrate 111 in plan view.

The printed circuit board 200 may generate a data signal applied to a data line of the display panel 110. The printed circuit board 200 may be electrically connected to the display panel 110 through at least one tape carrier package TCP. A data driving chip (not shown) may be mounted on the tape carrier package TCP.

The lower substrate 111 may include a gate driving chip (not shown) provided to at least one side and another side thereof to apply a gate signal to the gate line. The gate driving chip may be mounted on the lower substrate 111 through a chip on glass process. Unlike the present embodiment, in another embodiment, the gate driving chip may be provided as a gate driving circuit applying a gate signal. In the case, the gate driving circuit may be formed on another side of the lower substrate 111 through a thin film process of forming the display panel 110. Therefore, the gate driving circuit may be provided in the display panel 110.

The printed circuit board 200 may include a first printed circuit unit PC1 and a second printed circuit unit PC2. The first printed circuit unit PC1 and the second printed circuit unit PC2 may be electrically connected to each other by the connection member 300.

When the display panel 110 is curved in the first direction DR1, the printed circuit board 200 receives force from both ends of the display panel 110. According to the present embodiment, a gap between the first printed circuit unit PC1 and the second printed circuit unit PC2 may be increased corresponding to the force received from the both ends of both ends of the display panel 110. In this case, a shape of the connection member 300 may be deformed corresponding to the gap between the first printed circuit unit PC1 and the second printed circuit unit PC2. Therefore, a failure in which the printed circuit board 200 and the display panel 110 are separated from each other may be prevented.

Figure 2:
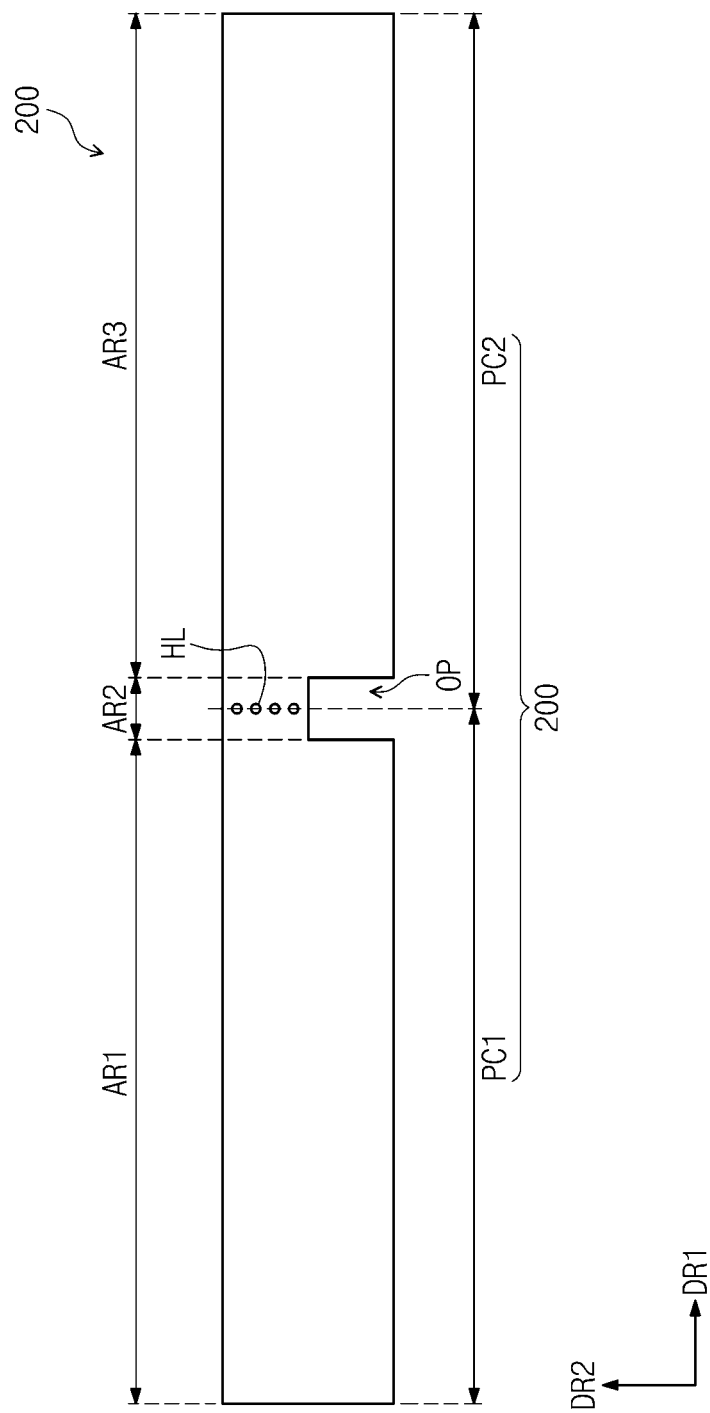
FIG. 2 is a schematic plain view illustrating a printed circuit board according to an embodiment of the inventive concept.

FIG. 2 is a schematic plan view illustrating a printed circuit board according to an embodiment of the inventive concept.

Referring to FIG. 2, the printed circuit board 200 may include a first region AR1, a second region AR2, and a third region AR3. The first region AR1 and the third region AR3 may face each other with the second region AR2 in-between. For example, the first region AR1, the second region AR2, and the third region AR3 may be sequentially disposed in the first direction DR1.

An opening OP and a hole HL may be defined in the second region AR2. The opening OP may be defined by opening one side of the second region AR2 when viewed in a plan view, and the hole HL may be defined between the other side of the second region AR2 and the opening OP. The one side and the other side of the second region AR2 may be spaced from each other in the second direction DR2 intersecting with the first direction DR1. In the present embodiment, the hole HL may be provided in plurality, and in this case, the holes HL may be arranged in the second direction DR2. The opening OP may extend about halfway into the thickness of the PCB, although this is not a limitation.

The printed circuit board 200 may be divided into a first printed circuit unit PC1 including the first region AR1 and a second printed circuit unit PC2 including the third region AR3 during a subsequent process of manufacturing the display apparatus 100. The first printed circuit unit PC1 may include the first region AR1 and a portion of the second region AR2 adjacent to the first region AR1, and the second printed circuit unit PC2 may include the third region AR3 and a portion of the second region AR2 adjacent to the third region AR3.

The first printed circuit unit PC1 and the second printed circuit unit PC2 may be more easily separated due to the presence of the opening OP. Also, the holes HL may help identify an area that includes a line of demarcation between the first printed circuit unit PC1 and the second printed circuit unit PC2.

The printed circuit board 200 may be formed through an injection molding process. For example, the printed circuit board 200 in which the opening OP and the holes HL are formed may be formed through a single injection molding process. Unlike the present embodiment, in another embodiment of the inventive concept, the holes HL may be formed by using a punching process on a circuit substrate (not shown) in which the opening OP is formed. As a result, the printed circuit board 200 may be formed. In another embodiment of the inventive concept, a rectangular circuit board (not shown) is prepared, and then the opening OP and the holes HL may be formed through a cutting process and the punching process.

The present embodiment shows that a shape of the opening OP is a rectangular shape in plan view, but the inventive concept is not limited thereto. For example, in another embodiment of the inventive concept, the opening OP may have various shapes such as an arch, or a triangle in plan view.

Also, the present embodiment shows that the holes HL are in the shape of a circle, and the holes HL are all opened in a thickness direction of the printed circuit board 200, but the inventive concept is not limited thereto. For example, in another embodiment of the inventive concept, the holes HL may have a polygonal shape. In another embodiment, the holes HL may have a wedge shape. Also, in another embodiment of the inventive concept, the holes HL may be omitted. In this case, a guide line such as a solid line or a dotted line may be printed instead of the holes HL. Also, in another embodiment of the inventive concept, the holes HL may be defined on a boundary between the first region AR1 and the second region AR2, and on a boundary between the second region AR2 and the third region AR3.

In the present embodiment, while it is described that the printed circuit board 200 is divided into the first printed circuit unit PC1 and the second printed circuit unit PC2, the inventive concept is not limited thereto. In another embodiment of the inventive concept, the printed circuit board 200 may have two or more openings (not shown), and in this case, the printed circuit board 200 may be divided into two or more parts. For example, when the printed circuit board (not shown) has two openings (not shown), the printed circuit board may be divided into a first printed circuit unit, a second printed circuit unit, and a third printed circuit unit.

The number of regions into which the printed circuit board 200 is divided may vary according to a size of the display panel (110 of FIG. 1), a curved curvature radius of the display panel (110 of FIG. 1), and the like. For example, as the size of the display panel (110 of FIG. 1) increases or the curvature radius of the display panel (110 of FIG. 1) decreases, the number of regions into which the printed circuit board 200 is divided may increase. As the printed circuit units are able to move independently of each other within a limited range, the more separate units there are, a more severe curvature can be accommodated.

Figure 3:
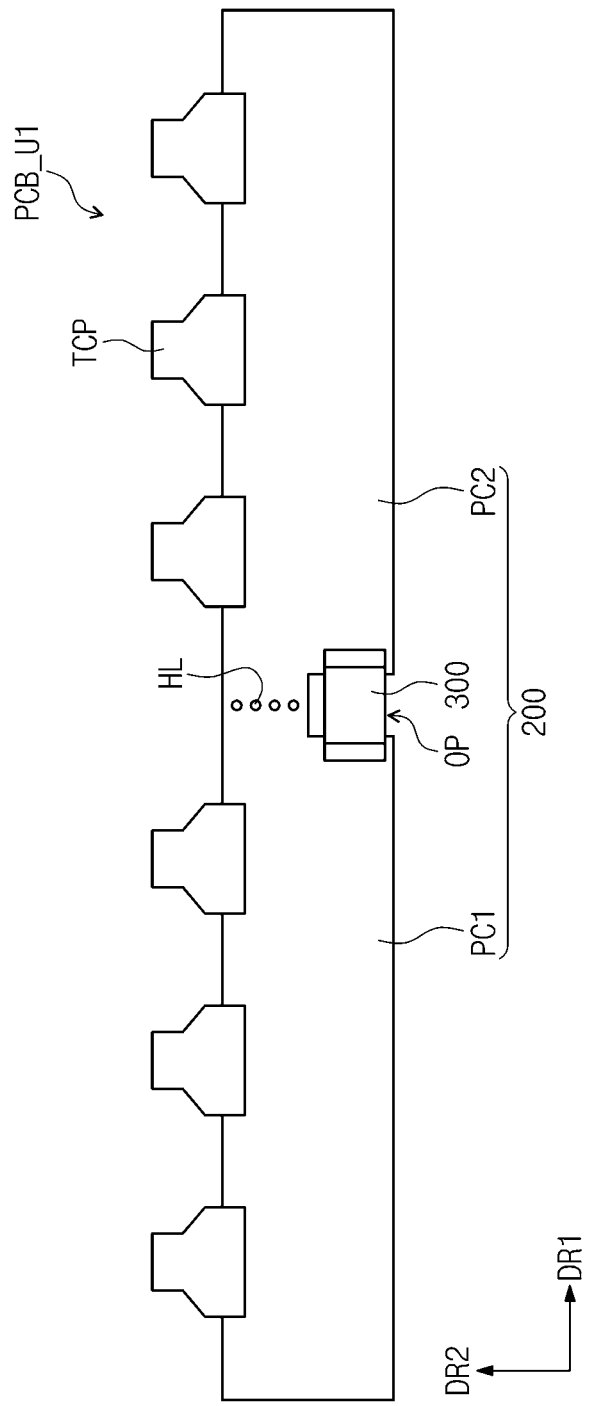
FIG. 3 is a schematic plain view illustrating a printed circuit board unit according to an embodiment of the inventive concept.
Figure 4:
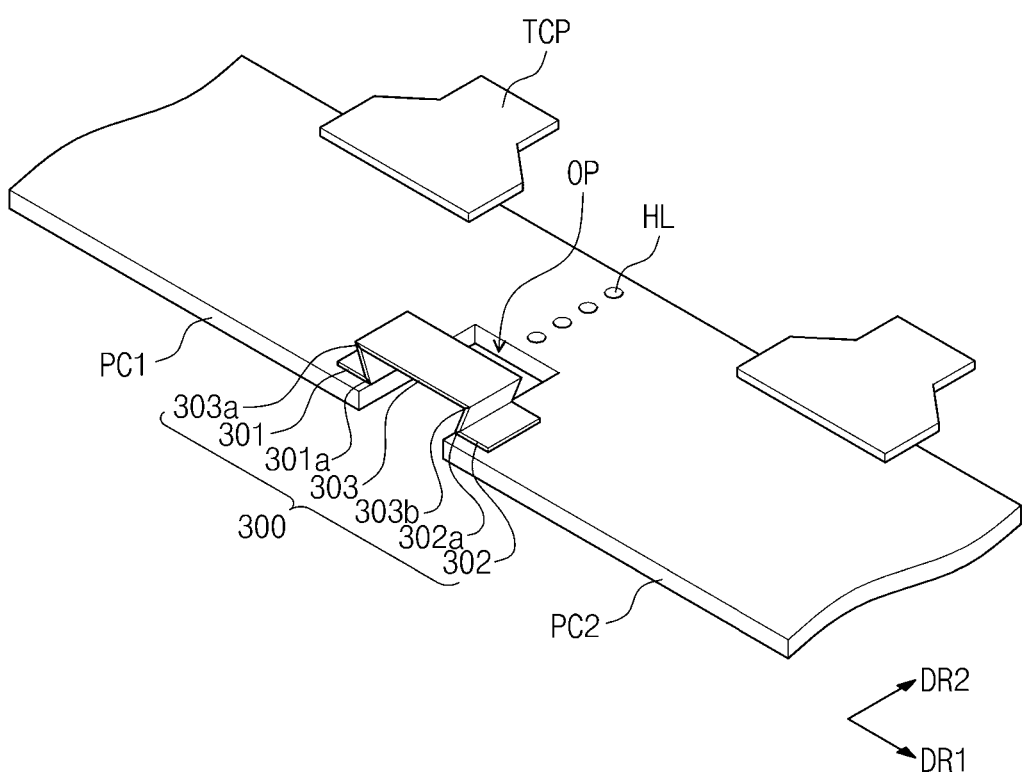
FIG. 4 is a schematic perspective view illustrating a printed circuit board unit illustrated in FIG. 3.

FIG. 3 is a schematic plan view illustrating a printed circuit board unit according to an embodiment of the inventive concept, and FIG. 4 is a schematic perspective view illustrating a printed circuit board unit illustrated in FIG. 3. In describing FIGS. 3 and 4, the same reference numbers are given to denote the same constituent elements as those described with reference to FIG. 2, and the description thereof will not be repeated.

Referring to FIGS. 3 and 4, a printed circuit board unit PCB-U1 may include a printed circuit board 200, a connection member 300, and a tape carrier package TCP. The printed circuit board 200 may include a first printed circuit unit PC1, a second printed circuit unit PC2, and an opening OP. The opening OP may be defined between the first printed circuit unit PC1 and the second printed circuit unit PC2.

The tape carrier package TCP may be a film material having flexibility and elasticity that allows for easy curving. In the present embodiment, the tape carrier package TCP may be provided in plurality. For example, the number of the tape carrier packages TCP may be two, three, four, or a plurality of four or more. A metal wiring (not shown) may be disposed on the tape carrier package TCP transferring an electrical signal. Also, a driving chip (not shown) is electrically connected to the metal wiring and may be disposed on the tape carrier package TCP.

The tape carrier package TCP may electrically connect the printed circuit board 200 and the display panel (110 of FIG. 1). A bonding pad (not shown) to which the tape carrier package TCP is electrically connected may be disposed on the printed circuit board 200. In the present embodiment, the tape carrier package TCP and the printed circuit board 200 may be connected through an anisotropic conductive film, but the inventive concept is not limited thereto.

In the present embodiment, the connection member 300 covers the opening OP, and may electrically connect the first printed circuit unit PC1 to the second printed circuit unit PC2. The connection member 300 may include a first coupling part 301, a second coupling part 302, and a connection part 303. The connection member 300 may be a film having flexibility and elasticity. Unlike the present embodiment, in another embodiment of the inventive concept, the connection member 300 may be a cable. In this case, a connector (not shown) may be disposed on each of the first printed circuit unit PC1 and the second printed circuit unit PC2 so as to be coupled to the connection member 300.

In the present embodiment, the connection member 300 may include first to fourth bent portions 301a, 302a, 303a, and 303b. In the particular embodiment, the connection part 303 includes a surface that is substantially parallel to the first and second coupling parts 301, 302 and two surfaces that connect to that parallel surface at angles 303a and 303b. The first bent portion 301a may be defined by the angle between the first coupling part 301 and the connection part 303, and the second bent portion 302a may be defined between the second coupling part 302 and the connection part 303. The third bent portion 303a and the fourth bent portion 303b may be defined in the connection part 303, as mentioned above.

A length in the first direction DR1 of the flexible connection member 300 may be greater than a width in the first direction DR1 of the opening OP. Therefore, even when a gap between the first printed circuit unit PC1 and the second printed circuit unit PC2 is increased during manufacturing the display apparatus (100 of FIG. 1), the first printed circuit unit PC1 and the second printed circuit unit PC2 may be electrically connected by the connection member 300.

Since the connection member 300 has flexibility, the first coupling part 301 and the second coupling part 302 may be lifted from the printed circuit board 200. However, according to the present embodiment, the connection member 300 may be prevented from being lifted from each of the first printed circuit unit PC1 and the second printed circuit unit PC2 by the first bent portion 301a and the second bent portion 302a.

According to the present embodiment, the first coupling part 301 and the second coupling part 302 may be in parallel to attachment surfaces of the printed circuit board 200 by the first bent portion 301a and the second bent portion 302a. Therefore, alignments of the first coupling part 301 and the second coupling part 302 may be easier.

Also, an unexpected warping or bending of the connection member 300 may be prevented by the first to fourth bent portions 301a, 302a, 303a, and 303b. Therefore, the connection member 300 electrically connecting the first printed circuit unit PC1 and the second printed circuit unit PC2 may be prevented from being broken.

The first printed circuit unit PC1 and the first coupling part 301 may be electrically connected by an anisotropic conductive film (not shown). In addition, the second printed circuit unit PC2 and the second coupling part 302 may be electrically connected by the anisotropic conductive film. In the present embodiment, the anisotropic conductive film may include fine conductive particles such as nickel, carbon, or lead particles, and an insulating adhesive. Therefore, according to the present embodiment, the connector or the like for coupling the first printed circuit unit PC1 and the first coupling part 301 may be omitted, which results in reducing process costs and reducing assembly time.

Figure 5:
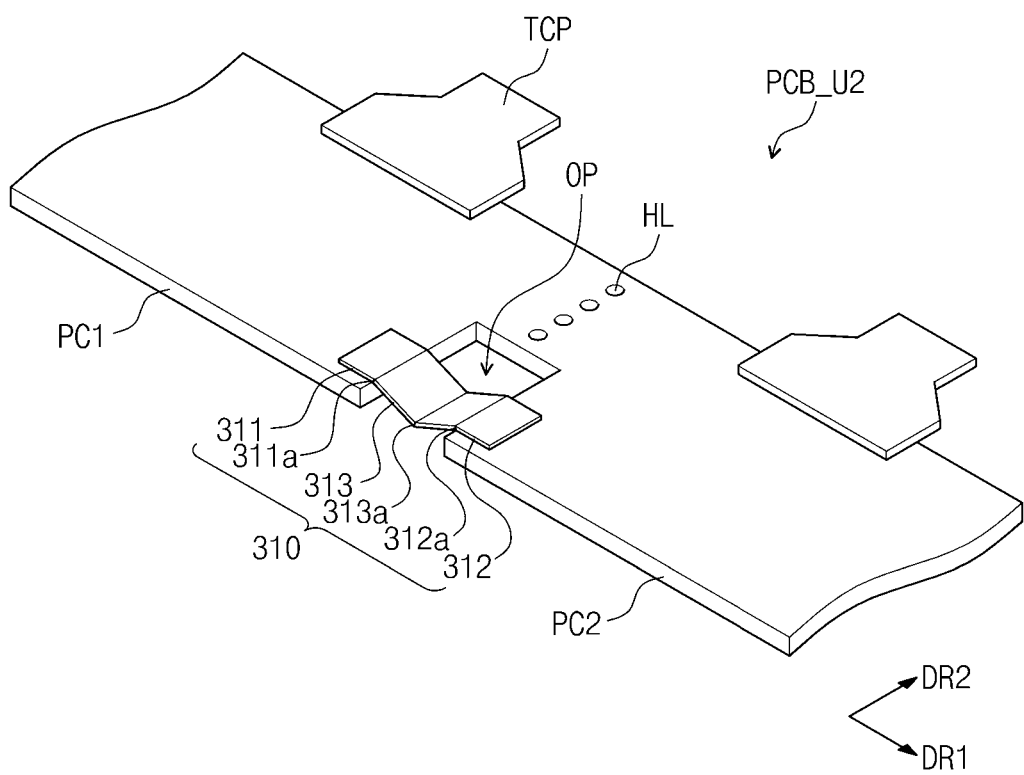
FIG. 5 is a schematic perspective view illustrating a printed circuit board unit according to an embodiment of the inventive concept.

FIG. 5 is a schematic perspective view illustrating a printed circuit board unit according to an embodiment of the inventive concept. In describing FIG. 5, the same reference numbers are given to denote the same constituent elements as those described with reference to FIGS. 3 and 4, and a description thereof will be omitted.

Referring to FIG. 5, a printed circuit board unit PCB-U2 may include a first printed circuit unit PC1, a second printed circuit unit PC2, a connection member 310, and a tape carrier package TCP. The connection member 310 may include a first coupling part 311, a second coupling part 312, and a connection part 313. The connection part 313 meets the first coupling part 311 to form a first bent portion 311a. The second coupling part 312 and the connection part 313 come together to form a second bent portion 312a. The connection part 313 includes two surfaces that come together to form a third bent portion 313a.

The connection part 313 may connect the first coupling part 311 to the second coupling part 312. The first bent portion 311a may be defined between the connection part 313 and the first coupling part 311, and the second bent portion 312a may be defined between the connection part 313 and the second coupling part 312. The third bent portion 313a may be defined in the connection part 313.

According to the present embodiment, each of the first bent portion 311a and the second bent portion 312a may be bent downward, extending into the opening OP. Therefore, the connection part 313 is accommodated in the opening OP and may cover the opening OP. For example, when the first coupling part 311 and the second coupling part 312 are press-attached by using an isotropic conductive film, the connection part 313 may protrude in a pressing direction to be bent. Therefore, the press-attachments of the first coupling part 311 and the second coupling part 312 may not be hindered by the connection part 313. As a result, processes of coupling the first coupling part 311 and the first printed circuit unit PC1, and the second coupling part 312 and the second printed circuit unit PC2 may be more easily performed.

Figure 6:
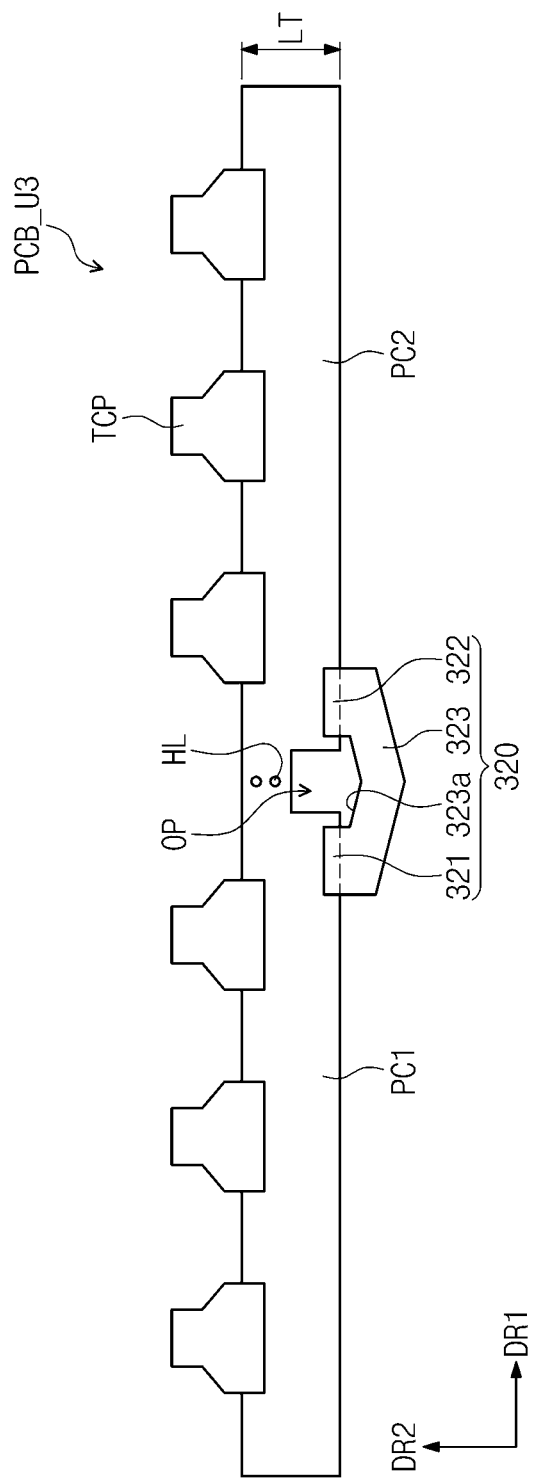
FIG. 6 is a schematic plain view illustrating a printed circuit board unit according to an embodiment of the inventive concept.

FIG. 6 is a schematic plan view illustrating a printed circuit board unit according to an embodiment of the inventive concept. In describing FIG. 6, the same reference numbers are given to denote the same constituent elements as those described with reference to FIGS. 3 and 4, and a description thereof will be omitted.

Referring to FIG. 6, a printed circuit board unit PCB-U3 may include a first printed circuit unit PC1, a second printed circuit unit PC2, a connection member 320, and a tape carrier package TCP. The connection member 320 may include a first coupling part 321, a second coupling part 322, and a connection part 323.

In the present embodiment, the first coupling part 321 and the second coupling part 322 may be electrically connected to the first printed circuit unit PC1 and the second printed circuit unit PC2, respectively. The connection part 323 may connect the first coupling part 321 to the second coupling part 322. Therefore, the connection part 323 does not cover the opening OP but extends off the edges of the first and second printed circuit units PC1, PC2 in the second direction DR2 in plan view.

A bent portion 323a may be defined on one side of the connection part 323 facing the opening OP in plan view. After the first printed circuit unit PC1 and the second printed circuit unit PC2 are divided during a subsequent process of manufacturing the display apparatus (100 of FIG. 1), when the display panel (110 of FIG. 1) is curved in the first direction DR1, the bent portion 323a may be curved or rounded. Therefore, a shape of the connection member 320, which corresponds to the gap between the first printed circuit unit PC1 and the second printed circuit unit PC2, may be easily deformed.

The first coupling part 321 and the second coupling part 322 extend in the first direction DR1 and may be respectively connected to the first printed circuit unit PC1 and the second printed circuit unit PC2. According to the present embodiment, the first coupling part 321 and the second coupling part 322 may be attached to the sides of the first and second printed circuit units PC1, PC2 that are opposite the sides to which the tape carrier package TCP is attached. Therefore, since widths in the second direction of the first coupling part 321 and the second coupling part 322 are decreased, lengths in the second direction DR2 of the first printed circuit unit PC1 and the second printed circuit unit PC2 may be decreased. As a result, manufacturing costs of the printed circuit board unit PCB-U3 may be reduced.

FIGS. 7 and 8 are schematic views illustrating a method of manufacturing a display apparatus. In describing FIG. 7, the same reference numbers are given to denote the same constituent elements as those described with reference to FIGS. 3 and 4, and any repetitive description thereof will be omitted.

Referring to FIGS. 7 and 8, a first end of a tape carrier package is coupled to the display panel 110. The present embodiment shows that after a second end of the tape carrier package TCP is coupled to a printed circuit board 200, the display panel 110 and the first end of the tape carrier package TCP are coupled, but the inventive concept is not limited to this sequence of steps. For example, in another embodiment of the inventive concept, after the first end of the tape carrier package TCP is coupled to the display panel 110, the second end of the tape carrier package TCP may be coupled to the printed circuit board 200. In another embodiment of the inventive concept, the first end of the tape carrier package TCP may be coupled to the display panel 110 at the same time that the second end of the tape carrier package TCP is coupled to the printed circuit board 200.

According to the present embodiment, a single printed circuit board 200 may be electrically connected to the display panel 110 before being separated into the first and second printed circuit units PC1, PC2 This way, the tape carrier packages TCP may be more easily aligned.

After the tape carrier package TCP and the display panel 110 are coupled, the printed circuit board 200 may be cut along holes HL defined on a second region (AR2 of FIG. 2). The printed circuit board 200 may be cut by using a blade, a laser, scissors, and the like.

After the printed circuit board 200 is cut and divided into the first printed circuit unit PC1 and the second printed circuit unit PC2, the display panel 110 may be curved in the first direction DR1. That is, according to the present embodiment, the printed circuit board 200 is divided before the display panel 110 is curved. Since the printed circuit board 200 is divided, any bending of the printed circuit board 200 caused by a curving of the display panel 110 is reduced, due to a decrease in stress applied to the printed circuit board 200. As a result, cracking of components mounted on the printed circuit board 200 may be avoided.

Also, the gap between the first printed circuit unit PC1 and the second printed circuit unit PC2 may be varied according to a curvature of the display panel 110. The shape of the connection member 300 may be bent or deformed corresponding to the gap between the first printed circuit unit PC1 and the second printed circuit unit PC2. Therefore, the gap between the first printed circuit unit PC1 and the second printed circuit unit PC2 may be varied corresponding to gap variations between the tape carrier packages according to the curvature variation of the display panel 110. As a result, an electric connection of the printed circuit board 200 and the display panel 110 may be prevented from being broken, which results in preventing failures of the display apparatus (100 of FIG. 1).

In a display apparatus manufacturing method according to an embodiment of the inventive concept, after a single printed circuit board 200 is attached to the display panel 110, the printed circuit board 200 is divided into the first printed circuit unit PC1 and the second printed circuit unit PC2. Therefore, the printed circuit board 200 and the display panel 110 may be easily aligned, and a process of electrically connecting the printed circuit board 200 and the display panel 110 may be more easily performed. Also, before the display panel 110 is curved in the first direction DR1, the printed circuit board 200 is divided into the first printed circuit unit PC1 and the second printed circuit unit PC2. Therefore, the stress applied to the printed circuit board 200 from curving of the display panel 110 may be reduced, and accordingly, failures generated in components mounted on the printed circuit board 200 and the tape carrier package TCP connecting the printed circuit board 200 and the display panel 110 may be decreased or prevented. Furthermore, since the shape of the connection member 300 is deformed corresponding to a gap variation between the first printed circuit unit PC1 and the second printed circuit unit PC2, the gap between the first printed circuit unit PC1 and the second printed circuit unit PC2 may be easily increased corresponding to the curvature radius of the display panel 110.

According to an embodiment of the inventive concept, since after a single printed circuit board is attached to a display panel, and the printed circuit board is divided into a first printed circuit unit and a second printed circuit unit, a process of connecting the printed circuit board and the display panel may be easily performed. Also, since the printed circuit board is divided into the first printed circuit unit and the second printed circuit unit before the display panel is curved, the damages of the printed circuit board and the carrier package according to a curving of the display panel may be prevented.

Furthermore, according to an embodiment of the inventive concept, a shape of a connection member connecting the first printed circuit unit and the second printed circuit unit is deformed according to a curvature of the display panel, so that a gap between the first printed circuit unit and the second printed circuit unit may be easily increased. Therefore, a failure in which the printed circuit board and the display panel are separated from each other may be prevented.

While the inventive concept has been particularly shown and described with reference to exemplary embodiments thereof, it will be understood by those of ordinary skill in the art that various changes in form and details may be made therein without departing from the substantial features of the embodiments. For example, each element specifically appearing in the embodiment may be carried out through a modification. All differences related in the modification and application thereof will be construed as being included within the scope of the invention as defined by the following claims.

What is claimed is:

1. A method of manufacturing a display apparatus, the method comprising:
    preparing a printed circuit board comprising a first region, a second region, and a third region wherein the second region is between the first region and the third region, the first region including a first printed circuit unit, the third region including a second printed circuit unit, and the second region having an opening;
    providing, on the printed circuit board, a connection member electrically connecting the first printed circuit unit and the second printed circuit unit;
    coupling a first end of a connection film to a display panel;
    coupling a second end of the connection film to the printed circuit board; and
    cutting the second region to divide the printed circuit board into the first printed circuit unit and the second printed circuit unit;
    wherein after the connection film is attached to the display panel and the printed circuit board, the printed circuit board is divided into the first printed circuit unit and the second printed circuit unit.

2. The method of claim 1, further comprising bending the display panel in a first direction,
    wherein the first region, the second region, and the third region are arranged in the first direction.

3. The method of claim 2, further comprising forming one or more holes in the second region,
    wherein the second region on which the holes are formed is cut to divide the printed circuit board into the first printed circuit unit and the second printed circuit unit.

4. The method of claim 1, wherein the connection member is provided on the printed circuit board to cover at least part of the opening.

5. The method of claim 4, wherein the connection member comprises a first coupling part, a second coupling part, and a connection part connecting the first coupling part to the second coupling part, and
    the providing of the connection member comprises:
    bending a first boundary between the first coupling part and the connection part;
    bending a second boundary between the second coupling part and the connection part;
    electrically connecting the first coupling part to the first printed circuit unit; and
    electrically connecting the second coupling part to the second printed circuit unit,
    wherein the first boundary and the second boundary are spaced apart from each other.

6. The method of claim 1, wherein the connection member comprises a first coupling part, a second coupling part, and a connection part connecting the first coupling part to the second coupling part without covering the opening, and
    the providing of the connection member comprises:
    electrically connecting the first coupling part to the first printed circuit unit; and
    electrically connecting the second coupling part to the second printed circuit unit.

7. The method of claim 6, wherein one side of the connection part has a bent portion in plan view, the one side of the connection part facing the opening.

8. The method of claim 1, wherein after the printed circuit board is divided into the first printed circuit unit and the second printed circuit unit, the display panel is curved in a first direction.

* * * * *